(12) United States Patent
Chen

(10) Patent No.: US 10,347,610 B2
(45) Date of Patent: Jul. 9, 2019

(54) MICRO LIGHT EMITTING DIODE TRANSFER-PRINTING DEVICES

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 308 days.

(21) Appl. No.: 15/514,078

(22) PCT Filed: Mar. 7, 2017

(86) PCT No.: PCT/CN2017/075838
§ 371 (c)(1),
(2) Date: Mar. 24, 2017

(87) PCT Pub. No.: WO2018/152866
PCT Pub. Date: Aug. 30, 2018

(65) Prior Publication Data
US 2018/0342485 A1    Nov. 29, 2018

(30) Foreign Application Priority Data

Feb. 21, 2017  (CN) .......................... 2017 1 0093395

(51) Int. Cl.
*H01L 23/00*         (2006.01)
*H01L 33/00*         (2010.01)
(Continued)

(52) U.S. Cl.
CPC .......... *H01L 25/0753* (2013.01); *H01L 24/75* (2013.01); *H01L 33/48* (2013.01);
(Continued)

(58) Field of Classification Search
CPC ......... H01L 21/673; H01L 2224/75651; H01L 2224/7598; H01L 24/75; H01L 25/0753;
(Continued)

(56) References Cited

U.S. PATENT DOCUMENTS

| 2003/0034120 A1* | 2/2003 | Yanagisawa | B44C 1/105 |
| | | | 156/238 |
| 2005/0214963 A1* | 9/2005 | Daniels | H01L 24/29 |
| | | | 438/29 |
| 2013/0130440 A1* | 5/2013 | Hu | H01L 24/83 |
| | | | 438/107 |

OTHER PUBLICATIONS

English translation of CN106170849.*
(Continued)

*Primary Examiner* — Sonya M Sengupta
(74) *Attorney, Agent, or Firm* — Andrew C. Cheng

(57) ABSTRACT

The present disclosure relates to a micro light emitting diode (Micro LED) transfer-printing device. A heating device and a movable cooling device are arranged on a rack, wherein a cooling surface of the cooling device is opposite to a heating surface of the heating device. A roller mechanism is arranged between the heating device and the cooling device, and a cyclically rotatable conveyor belt is configured on the roller mechanism. A temperature control glue is configured on an outer surface of the conveyor belt. Compared with the conventional solution, the proposed Micro LED transfer-printing device realizes cyclic absorption and transfer-printing of the Micro LED such that the transfer-printing efficiency may be enhanced.

9 Claims, 2 Drawing Sheets

(51) Int. Cl.
*H01L 33/48* (2010.01)
*H01L 33/62* (2010.01)
*H01L 25/075* (2006.01)

(52) U.S. Cl.
CPC .......... *H01L 33/62* (2013.01); *H01L 33/0079* (2013.01); *H01L 2224/7598* (2013.01); *H01L 2224/75651* (2013.01); *H01L 2933/0033* (2013.01); *H01L 2933/0066* (2013.01)

(58) Field of Classification Search
CPC ..... H01L 2933/0033; H01L 2933/0066; H01L 33/0079; H01L 33/48; H01L 33/62
USPC .... 438/21, 22, 107, 464; 156/277, 567, 582, 156/583.1
See application file for complete search history.

(56) References Cited

OTHER PUBLICATIONS

English translation of CN106228913.*
English translation of ISR of PCT/CN2017/075838.*
English translation of written opinion of PCT/CN2017/075838.*

* cited by examiner

MICRO LIGHT EMITTING DIODE TRANSFER-PRINTING DEVICES

BACKGROUND OF THE INVENTION

1. Field of the Invention

The present disclosure relates to micro light emitting diode (Micro LED) display field, more particularly to a micro light emitting diode transfer-printing device.

2. Discussion of the Related Art

Flat display device has been widely adopted in each kinds of consuming electronic products, such as mobile phones, personal digital assistants, digital cameras, laptops, desktop computers, and has become the main product in the display device due to attributes such as high-definition, power-saving, thin body and wide application.

Micro light emitting diode (Micro LED, µLED) display is one kind of high density tiny sized LED array integrated on a substrate, and the Micro LED is configured to be a monitor to display pixels and to achieve image display. Same as the large-size outdoor LED display, each of the pixels in the µLED can be address, illuminating alone, and can be viewed as a reduced version of the outdoor LED display, wherein the µLED reduces the pixel distance from millimeter to micrometer. µLED display is a self-luminous display, same as organic light-emitting diode (OLED). However, µLED display is considered to be the greatest competitor with OLED due to attributes such as better material stability, longer life, and has no image imprinting.

Micro transfer printing technique is the main method to produce µLED display device, and the producing process includes: first, growing µLED on a sapphire substrate, and separating the bare chip of the µLED from the sapphire substrate via laser lift-off (LLO) technique, and adhering the bare chip of the µLED from the sapphire substrate via a patterned polydimethylsiloxane (PDMS) transfer head, to accomplish the process of transferring the bare chip of the µLED to the receive substrate, thereby to produce µLED display.

Usually, the transfer process may adopt energized adsorption or PDMS absorption. However, it is difficult to control the peeling effect when adopting the PDMS to perform peeling; it is necessary to charge each of the suction head when adopting electric adherence, which is complicated and has poor peeling performance. There is also a technique for conducting Micro LED transfer process by temperature control, the principle is through the low temperature peeling type glue. The transfer process is divided into adherence process—transfer process—cooling process and accomplishment of the transfer process. However, the transfer rate is poor during the cooling process and the accomplishment of the transfer process, and is harmful to the repeated efficient transfer.

SUMMARY

In one aspect, the present disclosure relates to a micro light emitting diode (Micro LED) transfer-printing device, including: a rack, a heating device arranged on the rack wherein a heating surface of the heating device faces down, and a movable cooling device arranged under the heating device, wherein the heating surface of the heating device is configured to carry a supply substrate having at least one Micro LED. The supply substrate is fixed on the heating surface via a fixing member. A cooling surface of the cooling device is configured to carry a receive substrate, and the cooling surface of the cooling device is opposite to the heating surface of the heating device. A roller mechanism is arranged between the heating device and the cooling device, and the roller mechanism is fixed on the rack. A cyclically rotatable conveyor belt is configured on the roller mechanism, wherein the conveyor belt is formed by a transfer-printing film, and a temperature control glue is configured on an outer surface of the conveyor belt. The Micro LED on the heated supply substrate is adhered by the temperature control glue on the conveyor belt, and the roller mechanism rotates the conveyor belt to a side of the receive substrate to cool down the receive substrate via the cooling device and to remove a viscosity of the temperature control glue, such that the Micro LED adhered to the conveyor belt is peeled off to accomplish a Micro LED transfer-printing process. A power supplier is arranged on the rack and electrically connects to the roller mechanism, the heating device, and the cooling device.

A rotating direction of the roller mechanism is opposite to a moving direction of the cooling device.

A transmission mechanism connecting to the power supplier is arranged on the cooling device, and is configured to drive the cooling device to move.

The roller mechanism includes at least one driving roller and at least one driven roller, the conveyor belt is set on the driving roller and the driven roller. At least one driving wheel electrically connects to the power supplier.

The driving roller is an electric roller.

The outer surface of the conveyor belt is arranged with at least one rectangular protrusion in a matrix, a gap between two adjacent rectangular protrusions is equal, and the temperature control glue covers the rectangular protrusions and the gap between the rectangular protrusions.

A cooling medium of the cooling device is liquid nitrogen or dry ice.

The transmission mechanism includes: a driving motor connecting to the power supplier, the driving motor is fixed at a bottom end of the rack, a driving gear is configured on an output shaft of the driving motor, a feed rack is configured to mesh the driving gear, and a moving plate is arranged on the feed rack, and the cooling device is fixed on the moving plate.

The conveyor belt is made of flexible material.

In the view of the above, the present disclosure arranges the heating device and the cooling device, and configures a roller conveyor belt in between the heating device and the cooling device, and configures the temperature control glue on the outer surface of the conveyor belt to achieve cyclic absorption and transfer-printing of the Micro LED, and to enhance transfer efficiency.

DETAILED DESCRIPTION OF THE EMBODIMENTS

Embodiments of the invention will now be described more fully hereinafter with reference to the accompanying drawings, in which embodiments of the invention are shown.

Figure 1:
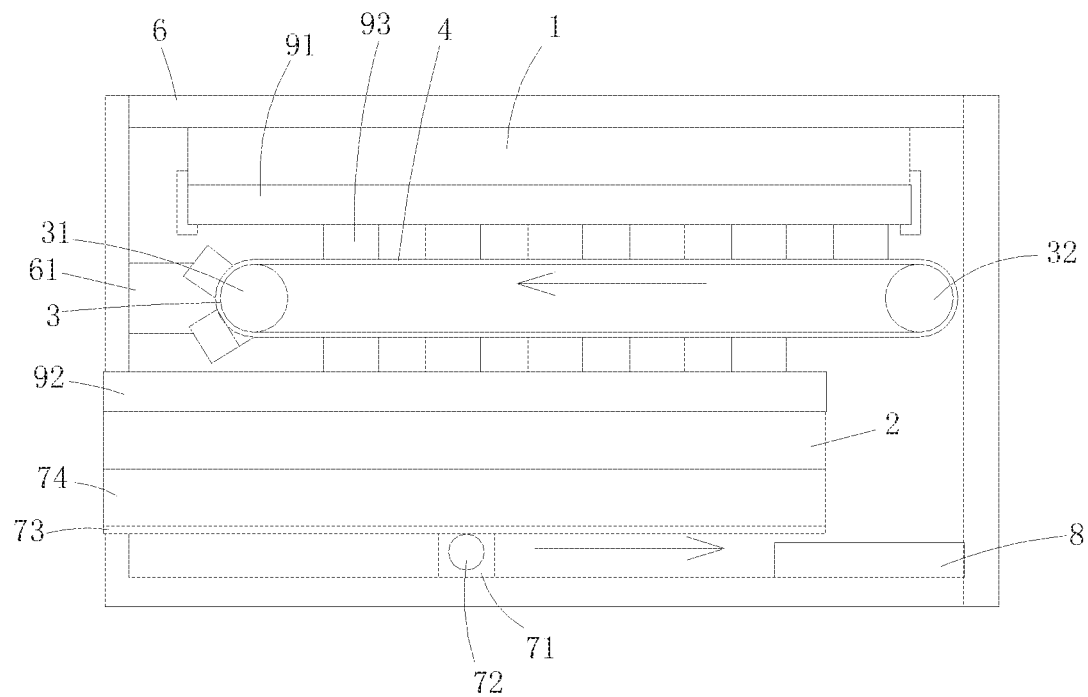
FIG. 1 is a schematic view of the micro LED transfer-printing device in accordance with one embodiment of the present disclosure.

As shown in FIG. 1, a micro light emitting diode (Micro LED) transfer-printing device, including: a rack 6, a heating device 1 arranged on the rack 6 wherein a heating surface of the heating device 1 faces down, and a cooling device 2 arranged under the heating device 1 wherein the cooling device 2 is driven by a driving motor. The heating surface of the heating device 1 is configured to carry a supply substrate 91 having at least one Micro LED 93. The supply substrate 91 is fixed on the heating surface via a fixing member, wherein the fixing member is a snap or a screw. A cooling surface of the cooling device 2 is configured to carry a receive substrate 92, and the cooling surface of the cooling device 2 is opposite to the heating surface of the heating device 1. A roller mechanism 3 is arranged between the heating device 1 and the cooling device 2, wherein the roller mechanism 3 is fixed on the rack 6. A cyclically rotatable conveyor belt 4 is configured on the roller mechanism 3, wherein the conveyor belt 4 is formed by a transfer-printing film. A temperature control glue 5 is configured on an outer surface of the conveyor belt 4, wherein the temperature control glue 5 is a glue which may melt and have a viscosity by heating up, while the viscosity may be removed by cooling down, such as low temperature peeling type temperature control peeling tape which losses viscosity and peels off at the temperature between 20-60° C. A power supplier 8 is arranged on the rack 6 and electrically connects to the roller mechanism 3, the heating device 1, and the cooling device 2, thereby to power the Micro LED transfer-printing device.

The Micro LED 93 on the heated supply substrate 91 is adhered by the temperature control glue 5 on the conveyor belt 4, and the roller mechanism 3 rotates the conveyor belt 4 to a side of the receive substrate 92 to cool down the receive substrate 92 via the cooling device 2, such that the Micro LED 93 adhered to the conveyor belt 4 is peeled off to accomplish a Micro LED 93 transfer-printing process.

Figure 2:
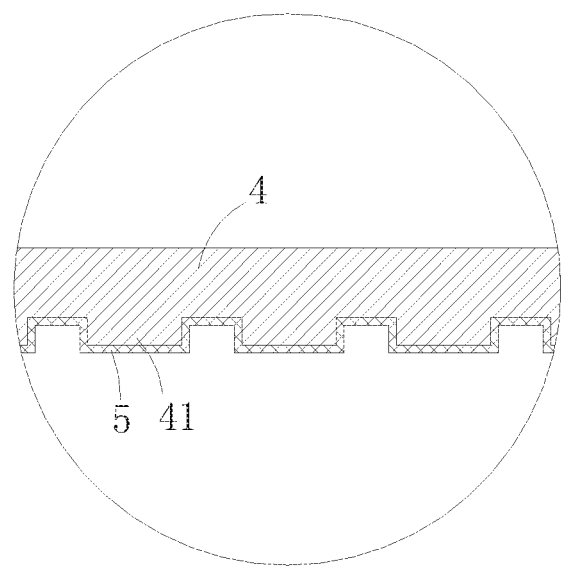
FIG. 2 is a schematic view of a conveyor belt in accordance with one embodiment of the present disclosure.

As shown in FIG. 2, the outer surface of the conveyor belt 4 is arranged with at least one rectangular protrusion 41 in a matrix, and a gap between two adjacent rectangular protrusions 41 is equal. The temperature control glue 5 covers the rectangular protrusions 41 and the gap between the rectangular protrusions 41. A width of the gap between the rectangular protrusions 41 is equal to a width of a gap between two Micro LEDs 93, thereby to precisely adhere the Micro LED 93.

Specifically, the conveyor belt 4 is set on the roller mechanism 3, wherein the conveyor belt 4 is a bended transfer-printing film and forms an O shape by connecting the head of the transfer-printing film and tail of the transfer-printing film, and the conveyor belt 4 is made of flexible material to satisfy flexible requirements.

As shown in FIG. 1, the roller mechanism 3 includes at least one driving roller 31 and at least one driven roller 32, and a gap may be preserved therebetween to tighten the conveyor belt 4. A transmission channel is formed via tiling the driving rollers 31 and the driven roller 32. The conveyor belt 4 is set on the outermost roller on both sides to tighten the conveyor belt 4. This tiling roller may have certain bearing force with respect to the conveyor belt 4 and may enhance the transfer-printing efficiency. The driving roller 31 electrically connects to the power supplier 8.

A first bracket 61 is horizontally arranged in the middle of the rack 6, and is configured to fix the roller mechanism 3. A shaft is arranged on the first bracket 61 and is configured to connect the driving roller 31 and the driven roller 32, wherein both ends of the driving roller 31 and the driven roller 32 are set in the shaft.

In one embodiment, the driving roller 31 is an electric roller, wherein a driving motor and a reducer are integrated in the driving roller 31. The driven roller 32 is a regular roller without any driving force.

The transmission mechanism of the present disclosure may adopt conventional transmission mechanisms of the prior art, such as a belt drive, a gear drive, a rack drive or a screw drive. In one embodiment, as shown in FIG. 1, the transmission mechanism includes: the driving motor 71 connecting to the power supplier 8 wherein the driving motor 71 is fixed at a bottom end of the rack 6, a driving gear 72 is configured on an output shaft of the driving motor 71, a feed rack 73 is configured to mesh the driving gear 72. The output shaft of the driving motor 71 is parallel to an axis direction of the driving roller 31, and the feed rack 73 is perpendicular to the driving roller 31. A moving plate 74 is arranged on the feed rack 73, and the cooling device 2 is fixed on the moving plate 74.

Figure 5:
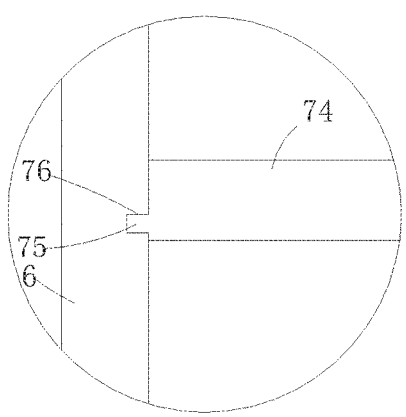
FIG. 5 is a schematic view of the connection between a moving plate and a rack in accordance with one embodiment of the present disclosure.

As shown in FIG. 5, at least one guide bar 75 is arranged on both sides of the moving plate 74 opposite the rack 6, wherein the guide bar 75 is parallel to the feed rack 73. At least one guide slot 76 is arranged on the rack 6 wherein the guide slot 76 is parallel to the feed rack 73, and the guide bar 75 is set in the guide slot 76.

When the driving motor 71 drives the driving gear 72 to rotate, the driving gear 72 drives the feed rack 73 to move, such that the cooling device 2 may be driven by the moving plate 74 and the cooling device 2 configured on the receive substrate 92 may rotate to an opposite side of the rotating direction of the roller mechanism 3, i.e., when the roller mechanism 3 rotates clockwise, the driving motor 71 rotates counterclockwise.

Figure 3:
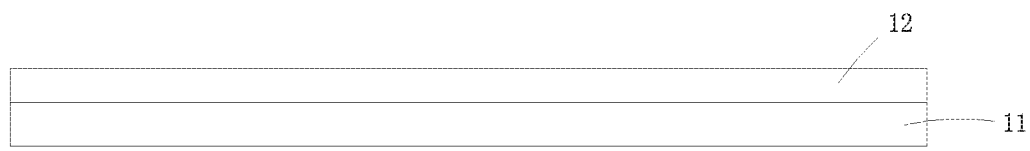
FIG. 3 is a schematic view of a heating device in accordance with one embodiment in the present disclosure.

The heating device of the present disclosure may adopt conventional heating platform, such as constant temperature heating platform. Otherwise, as shown in FIG. 3, the heating device includes a metal plate 11 having the heating surface, wherein at least one PCT heater 12 is arranged on the metal plate 11. The power supplier 8 charges the PCT heater 12 to generate heat, and the heat is transferred to the supply substrate 91 via the metal plate 11. The temperature control glue 5 melts and adheres the Micro LED 93 due to the Micro LED 93 transfers the heat to the temperature control glue 5 on the conveyor belt 4.

Figure 4:
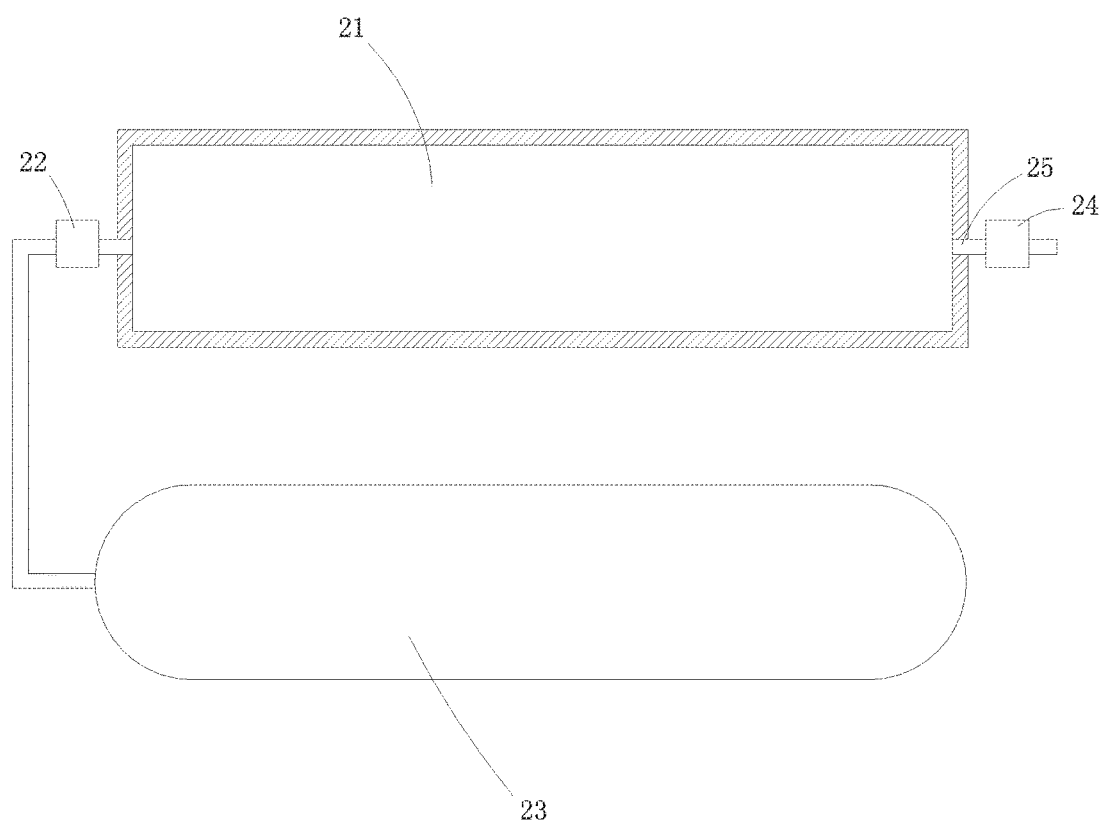
FIG. 4 is a schematic view of a cooling device in accordance with one embodiment in the present disclosure.

The cooling device of the present disclosure may adopt the cooling device shown in FIG. 4. The cooling device includes a metal container 21 which may carry a cooling medium, wherein a cross-section of the metal container 21 is rectangle shape. The cooling surface is formed at an opposite side of the heating device. The metal container 21 carries the cooling medium. An inner chamber of the metal container 21 connects with a storage tank 23 filled with the cooling medium via a first solenoid valve 22. An exhaust vent 25 is arranged on the metal container 21, wherein a second solenoid valve 24 is arranged on the exhaust vent 25. When a side of the conveyor belt adhering the Micro LED 93 is rotated to a side opposite to the cooling surface of the metal container 21, the cooling surface cools down the receive substrate 92. When the lower temperature is transferred to the temperature control glue 5 via the Micro LED 93, the viscosity of the temperature control glue 5 may be removed, such that the Micro LED 93 may be peeled off from the conveyor belt 4 to accomplish the transfer-printing process. The first solenoid valve 22 and the second solenoid valve 24 both electrically connect to the power supplier 8.

In one embodiment, the cooling medium is liquid nitrogen or dry ice.

In one embodiment, a PLC (programmable logic control) is arranged to control the operation of the heating device 1, the cooling device 2, the roller mechanism 3, and the transmission mechanism.

It is believed that the present disclosure is fully described by the embodiments, however, certain improvements and modifications may be made by those skilled in the art without departing from the principles of the present application, and such improvements and modifications shall be regarded as the scope of the present application.

What is claimed is:

1. A micro light emitting diode (Micro LED) transfer-printing device, comprising:
    a rack;
    a heating device arranged on the rack, wherein a heating surface of the heating device faces down;
    a movable cooling device arranged under the heating device;
    wherein the heating surface of the heating device is configured to carry a supply substrate having at least one Micro LED, the supply substrate is fixed on the heating surface via a fixing member, a cooling surface of the cooling device is configured to carry a receiving substrate, and the cooling surface of the cooling device is opposite to the heating surface of the heating device;
    a roller mechanism is arranged between the heating device and the cooling device, the roller mechanism is fixed on the rack, a cyclically rotatable conveyor belt is configured on the roller mechanism, wherein the conveyor belt is formed by a transfer-printing film, and a temperature control glue is configured on an outer surface of the conveyor belt, the Micro LED on the heated supply substrate is adhered by the temperature control glue on the conveyor belt, the roller mechanism rotates the conveyor belt to a side of the receiving substrate to cool down the receiving substrate via the cooling device and to remove a viscosity of the temperature control glue, such that the Micro LED adhered to the conveyor belt is peeled off to accomplish a Micro LED transfer-printing process;
    a power supplier is arranged on the rack and electrically connects to the roller mechanism, the heating device, and the cooling device.

2. The Micro LED transfer-printing device according to claim 1, wherein a rotating direction of the roller mechanism is opposite to a moving direction of the cooling device.

3. The Micro LED transfer-printing device according to claim 1, wherein a transmission mechanism connecting to the power supplier is arranged on the cooling device, and is configured to drive the cooling device to move.

4. The Micro LED transfer-printing device according to claim 1, wherein the roller mechanism comprises at least one driving roller and at least one driven roller, the conveyor belt is set on the driving roller and the driven roller, and at least one driving wheel connects to the power supplier.

5. The Micro LED transfer-printing device according to claim 4, wherein the driving roller is an electric roller.

6. The Micro LED transfer-printing device according to claim 1, wherein the outer surface of the conveyor belt is arranged with at least one rectangular protrusion in a matrix, a gap between two adjacent rectangular protrusions is equal, and the temperature control glue covers the rectangular protrusions and the gap between the rectangular protrusions.

7. The Micro LED transfer-printing device according to claim 1, wherein a cooling medium of the cooling device is liquid nitrogen or dry ice.

8. The Micro LED transfer-printing device according to claim 3, wherein the transmission mechanism comprises:
    a driving motor connecting to the power supplier, the driving motor is fixed at a bottom end of the rack, a driving gear is configured on an output shaft of the driving motor, a feed rack is configured to mesh the driving gear, and a moving plate is arranged on the feed rack, and the cooling device is fixed on the moving plate.

9. The Micro LED transfer-printing device according to claim 1, wherein the conveyor belt is made of flexible material.

* * * * *